United States Patent [19]
Ikegaya et al.

[11] Patent Number: 4,983,827
[45] Date of Patent: Jan. 8, 1991

[54] LINESCAN APPARATUS FOR DETECTING SALIENT PATTERN OF A PRODUCT

[75] Inventors: Kazutoshi Ikegaya, Sagamihara; Kunio Sannomiya, Atusgi; Yukifumi Tsuda, Kawasaki; Yuji Maruyama, Tokyo; Nobuhiro Araki; Hiroto Toba, both of Yokohama, all of Japan

[73] Assignee: Matsushita Electric Industrial Co., Ltd., Kadoma, Japan

[21] Appl. No.: 427,507

[22] Filed: Oct. 25, 1989

[30] Foreign Application Priority Data

Oct. 25, 1988 [JP]  Japan .................................. 63-268437

[51] Int. Cl.$^5$ .............................................. H01J 3/14
[52] U.S. Cl. ...................................... 250/235; 250/561
[58] Field of Search ............... 250/234, 235, 236, 562, 250/563, 571, 572, 561; 356/376, 392, 393, 394; 350/6.6, 6.7; 382/8

[56] References Cited

U.S. PATENT DOCUMENTS

| 4,642,813 | 2/1987 | Wilder | 382/8 |
| 4,681,453 | 7/1987 | Sick | 356/394 |
| 4,775,238 | 10/1988 | Weber | 250/563 |
| 4,811,410 | 3/1989 | Amir et al. | 382/8 |

FOREIGN PATENT DOCUMENTS 63-179245  7/1988  Japan .

Primary Examiner—David C. Nelms
Attorney, Agent, or Firm—Cushman, Darby & Cushman

[57] ABSTRACT

A linescan apparatus for detecting salient pattern on a surface of a product comprises: a laser light source for continuously emitting a laser beam; a polygon mirror for reflecting the laser beam; a drive for rotating the polygon mirror to scan said laser beam; an fθ lens arranged such that the linescan laser beam strikes against the plane perpendicularly; a carrying device for moving the product in the direction substantially perpendicular to the plane; a mirror for reflecting the linescan laser beam reflected at a surface of the product to direct the linescan laser beam to the polygon mirror through the fθ lens, the mirror being positioned apart from the second plane; and a beam position detector for detecting unidimensional position of a spot mede by the linescan laser beam projected thereon from the mirror via the polygon mirror. This linescan apparatus provides three-dimensional data of a surface of the product. The detected position signal is compared by reference data for inspecting the product. An linescan apparatus further comprises second beam position detector and an averaging circuit for averaging outputs from first mentioned and second beam detectors.

9 Claims, 6 Drawing Sheets

LINESCAN APPARATUS FOR DETECTING SALIENT PATTERN OF A PRODUCT

BACKGROUND OF THE INVENTION

1. Field of the Invention

This invention relates to a linescan apparatus for detecting pattern on a surface of a product.

2. Description of the Prior Art

A linescan apparatus for detecting salient pattern on a surface of a product is known which detects salient pattern on a surface of a product, particularly, a circuit board to detect for defects, such as misinserted leads or missing or mis-sized components, by directing beams of light towards the surface along a first angular direction. The intensity of the light reflected along a second direction from each of a plurality of successive thin strips running across the surface is sensed by a linescan camera which moves relative to the circuit board. The output signal produced by the linescan camera, as the linescan camera moves across the circuit board, are processed to obtain image data representative of each of the strips. Only the image data representative of predetermined regions within each strip where defects may occur are retained. The retained image data are then analyzed to determine if defects are present.

Such linescan apparatus is disclosed in U.S. Pat. No. 4,811,410.

However, there is a drawback that it is impossible to detect salient pattern of a surface of the product, or of components mounted on a circuit board to be detected. In other wards, there is a drawback that it is impossible to detect that a component soldered on a circuit board does not surly seat on the circuit board; only one pin of an IC circuit mounted on a circuit board by soldering is not soldered, for the pin does not reach to the surface of the circuit board; or a component soldered leans.

SUMMARY OF THE INVENTION

The present invention has been developed in order to remove the above-described drawback inherent to the conventional linescan inspection apparatus for detecting salient pattern on a surface of a product.

According to the present invention there is provided a linescan apparatus for detecting salient pattern on a surface of a product comprising: a laser light source for continuously emitting a laser beam; a polygon mirror for reflecting the laser beam; a drive for rotating the polygon mirror to scan the laser beam; an $f\theta$ lens for focusing the laser beam from the polygon mirror onto a first plane perpendicular to a second plane in which the laser beam reflected at the polygon mirror is scanned, the $f\theta$ lens being arranged such that the polygon mirror located near a focus point of the $f\theta$ lens to cause the laser beam therefrom strikes against the first plane substantially perpendicularly; a carrying portion for moving the product along the first plane in the direction substantially perpendicular to the second plane; a mirror for reflecting the laser beam reflected at the surface of the product to direct the laser beam to the polygon mirror through the $f\theta$ lens, the mirror being positioned apart from the second plane; a detector for detecting unidimensional position variation of a beam spot made thereon by the laser beam from the mirror via the polygon mirror.

According to the present invention there is also provided a linescan apparatus as mentioned above, further comprising: a signal generating circuit for generating a read signal in response to rotation of the polygon mirror; a storing circuit for storing preset data and for outputting the preset data in response to the read signal; and a subtractor for obtaining difference between an output signal from the beam position detector and preset data.

According to the present invention there is also provided a third linescan apparatus comprising: a laser light source for continuously emitting a laser beam; a polygon mirror for reflecting the laser beam; a drive for rotating the polygon mirror to scan the laser beam an $f\theta$ lens for focusing the laser beam from the polygon mirror onto a first plane perpendicular to a second plane in which the laser beam reflected at the polygon mirror is scanned, the $f\theta$ lens being arranged such that the polygon mirror located near a focus point of the $f\theta$ lens to cause the laser beam therefrom strikes against the first plane substantially perpendicularly; a carrying portion for moving the product along the first plane in the direction substantially perpendicular to the second plane; first and second mirrors the laser beam reflected at the surface of the product to direct the laser beam to the polygon mirror through the $f\theta$ lens, the first mirrors being positioned apart from the second plane, the second mirror bing positioned at counter position of the first mirror with respect to the first plane; first and second detectors for detecting unidimensional position variation of beam spots made thereon by the laser beam from the first and second mirrors via the polygon mirror respectively; and an averaging circuit for averaging outputs from the first and second beam potion detector.

This linescan apparatus provides three-dimensional data of a surface of the product.

BRIEF DESCRIPTION OF THE DRAWINGS

The object and features of the present invention will become more readily apparent from the following detailed description taken in conjunction with the accompanying drawings in which.

The same or corresponding elements or parts are designated at like references throughout the drawings.

DETAILED DESCRIPTION OF THE INVENTION

Figure 1:
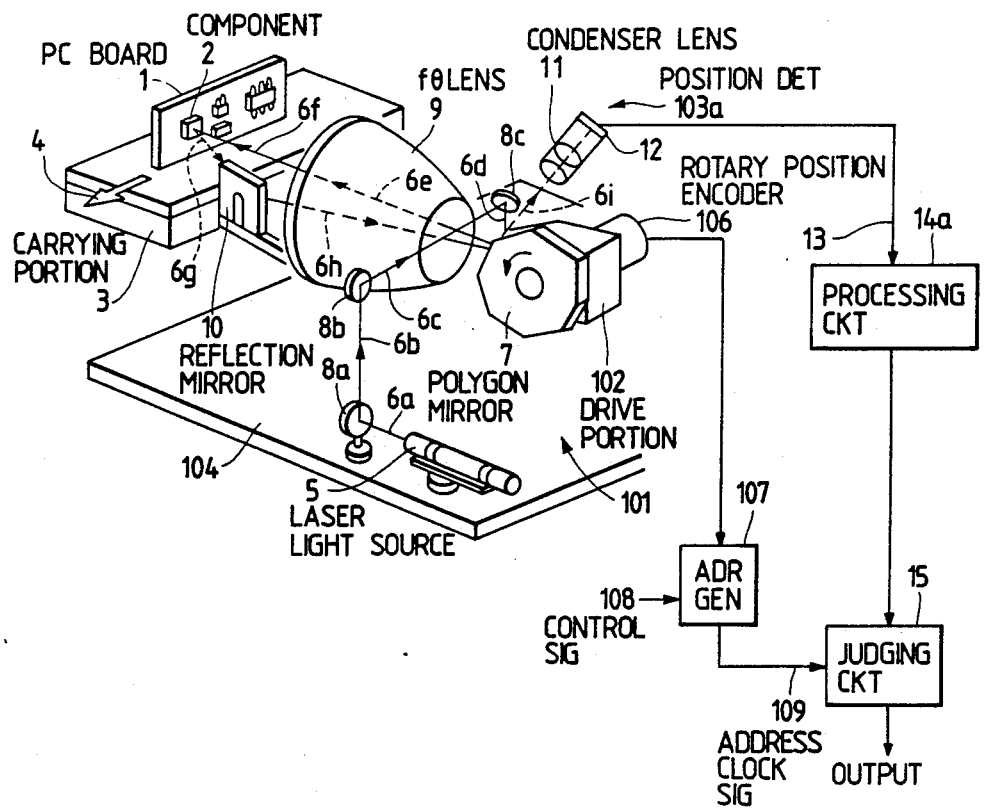
FIG. 1 is a block diagram of linescan apparatus of a first embodiment of the invention.

Referring now to the drawings, FIG. 1 is a block diagram of a linescan apparatus for detecting salient pattern on a surface of a product of a first embodiment of the invention.

In FIG. 1, a linescan apparatus for detecting salient pattern on a surface of a product comprises: a laser light source 5 for continuously emitting a laser beam 6a; a beam deflecting portion 101 for continuously deflecting the laser beam 6d introduced from the laser light source 5 through mirrors 8a, 8b, and 8c within a given angular range repeatedly, i.e., for producing linescan laser beam, having: a polygon mirror 7 for reflecting the laser beam 6d; and a drive portion 102 for driving the polygon mirror 7 to rotate; a carrying portion 3 for carrying a print circuit board 1 on which components 2 are mounted, in the direction shown by an arrow 4 substantially perpendicular to a plane including continuously defected laser beam 6e from the polygon mirror 7; an fθ lens 9 for producing a laser beam 6f which scans the surface of the printed circuit board 1 at a constant speed and with in focus along a line, the produced laser beam 6f striking perpendicularly to the surface of the printed circuit board 1 by arranging a mirror surface of the polygon mirror near a focus point of the fθ lens 9; a reflection mirror 10 for reflecting laser light ray 6g obtained by reflecting the laser beam 6f on an surface of the printed circuit board 1 or the surface of components 2 to direct the laser light ray 6g to the polygon mirror 7, the reflection mirror 10 being arranged apart from the plane for providing a given reflection angle of the laser light 6g and arranged to face to the plane of deflected laser beam; a beam spot position detector 103a for detecting unidimensional position of a beam spot of the laser light ray projected thereon from the reflection mirror 10 via the polygon mirror 7.

Figure 2:
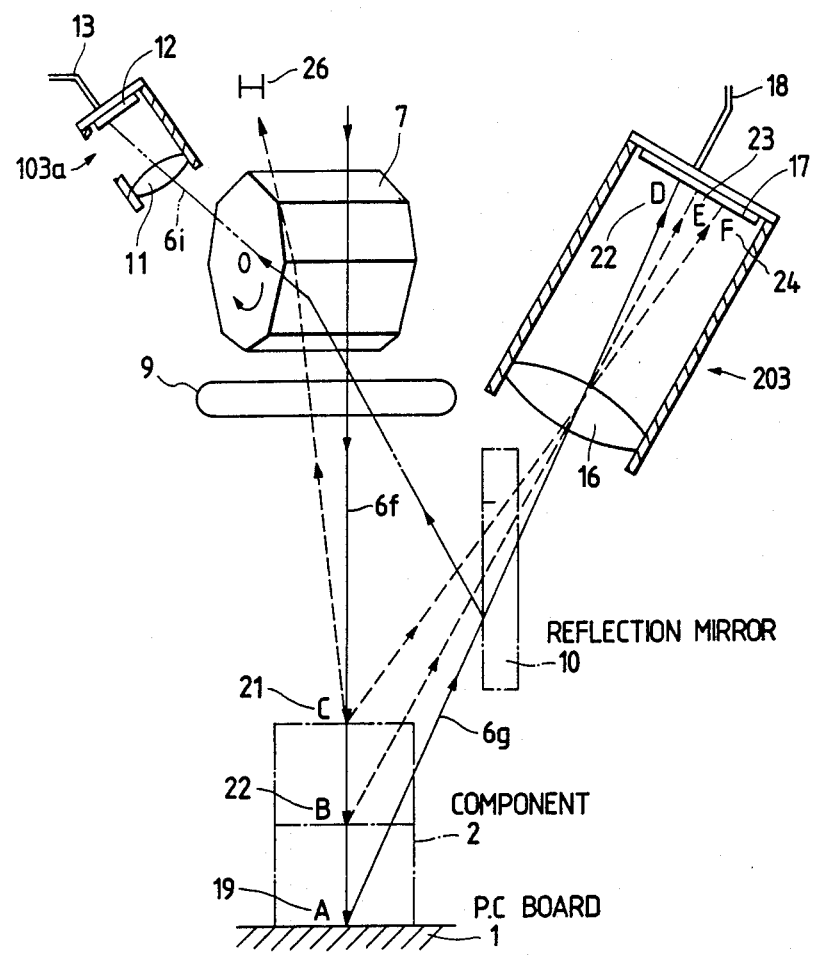
FIG. 2 is an explanatory diagram showing the operation of the embodiments of the invention.
Figure 4:
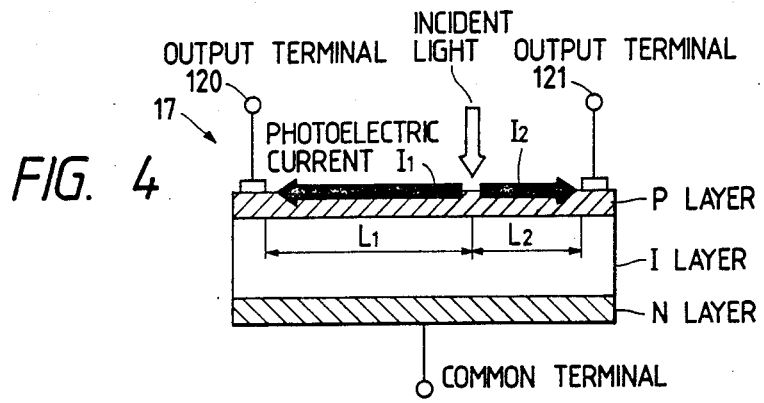
FIG. 4 is a schematic side view of the position sensitive detector of FIG. 1.

The beam spot position detector 103a comprises a condenser lens 11 for receiving and converging the laser light 6i from the polygon mirror 7, as shown FIG. 2, and a unidimensional type of a position sensitive detector (PSD) 12 so arranged that its position detection direction is parallel to the base plate 104. As shown in FIG. 4, the PSD 12 produces position data of beam spot projected thereon as follows:

A spot of an incident light ray generates, in a P type resistive layer, a photoelectric current which divided into two currents I1 and I2 flowing to output terminal 105 and 106 through a p type resistive layer of PSD 12 respectively. An intensity of the current I1 is obtained by dividing the photoelectric current at an inverse ratio of distances L1 to L2 where the distance L1 is that from the beam spot to an output terminal 120; the distance L2, that from the beam spot to an output terminal 121. Therefore, the position of the spot on the PSD 12 is detected by measuring current intensities of the output terminals 120 and 121. This information of current intensity indicates height or salient pattern on the printed circuit board 1 to be detected. In this embodiment, an object whose salient pattern is to be detected is a circuit board 1. However, salient pattern of other product can be detected, for example, an assembled keyboard. In this embodiment, a PSD of model number S1543, manufactured by HAMAMATSU PHOTONICS K.K is used as the PSD 12. However, other photoelectric conversion elements can be used for detecting position of a beam spot, for example, unshown photodiode array and comparator array responsive to the photodiode array or unshown line CCD and an unshown comparator responsive to the line CCD. Output currents I1 and I2 from terminal 105 and 106 as a position signal 13 are converted into voltage signals V1 and V2 by resistors with a predetermined resistance value. The voltage signals V1 and V2 is sent to a position signal processing circuit 14a comprising; and a/d converter 31 converting the analog voltage signals V1 and V2 into digital voltage signals V1 and V2 to be sent to a position calculation circuit 32 for calculating position data from voltage signals V1 and V2 in accordance with the equation as follows:

$$P = K \cdot V1/(V1 + V2) \tag{1}$$

where K is a given constant and P represents distance from one of the output terminals 120 and 121 to the beam spot on the PSD 12 which is corresponding to a distance from the surface of the printed circuit board 1 with components 2 to the position detector 103a.

An output P of the calculation circuit 32 is sent to a conversion table circuit 33 which converts output P into height data from the level of the circuit board 1 through an unshown conversion table. An output of the conversion table circuit 33 is supplied to a subtractor 36 which subtracts this output signal from reference data from a memory 35. The memory 35 stores preset reference data and outputs the reference data in response to address and clock signals 109 made from a rotary position signal indicative of rotational position of the polygon mirror 7, produced by a rotary encoder 106 linked with the drive portion 102. The rotary position encoder 106 produces a rotary position signal and an index signal which are sent to an address generating circuit 107 for generating address and clock signals 109, the address signal indicating two-dimensional positions of the surface of the circuit board 1. The address signal generating circuit 107 begins to produce the address and clock signal 109 in response to a control signal 108 which starts the carrying portion 3 to move at a given speed.

The subtractor 36 outputs data indicative of difference between the reference data and the detected position data from the conversion table circuit 33. This difference data is sent to a comparing circuit 38 which compares the difference data with threshold data from a memory 37 to produce the resultant inspection data of the circuit board 1. When the difference data is large than the threshold data, the comparing circuit 38 outputs an error signal. The memory 37 stores preset threshold data and is also read in response to an address and clock signals 109.

The start timings of carrying portion 3 and of read timing of the memories 35 and 37 are controlled by the control signal 108. Therefore, no position detector in the carrying direction is required. The printed circuit board 1 is mounted on the base plate 104 with its position adjusted.

Hereinbelow will be described operation of the first embodiment of the linescan apparatus for detecting salient pattern.

The printed circuit board 1 on which components 2 are mounted is fixed to the carrying portion 3 with its position adjusted. The drive portion 102 rotates the polygon mirror 7 at a substantially constant rotational speed. The laser beam 6a emitted by the laser light source 5 is introduced to the rotating polygon mirror 7 by mirrors 8a, 8b, and 8c and then continuously deflected by the polygon mirror 7 at a substantially constant angular velocity. The defected laser beam 6e is projected onto the surface of the printed circuit board 1 through an fθ lens which causes the deflected laser beam 6e to scan the printed circuit board 1 such that the incident angle of the laser beam 6f to the printed circuit board 1 is at a right angle; a liner velocity of the scanning spot is constant; and the laser beam 6e deflected focuses on the surface of the printed board 1. In response to the control signal 108, the carrying portion 3 carries the printed circuit board 1 in the direction shown by the arrow 4 and the address generator 107 produces the address and clock signals 109. The printed circuit board 1 is line-scanned by the laser beam 6f deflected by the polygon mirror 7 and scanned in the sub-scanning direction by the carrying portion 3. This causes the printed circuit board to be scanned over the whole surface, i.e., scanned two-dimensionally.

The laser beam 6f incident to the printed circuit board 1 is reflected at the surface or components 2 of the printed circuit board 1 with the reflection beam 6g scattered. The scattered laser beam 6g is reflected at the reflection mirror 10 to directing it to the position detector 103a via the polygon mirror 7. The laser beam 6h reflected at the reflection mirror 10 includes height information. This operation for obtaining height information is described more specifically with reference to FIG. 2. The laser beam 6f incident to the printed circuit board 1 is reflected at the surface or components 2 of the printed circuit board 1 with the reflection beam 6g scattered at point A 19, point B 22, or point C 21. The reflection points 19, 22, and 21 are determined by the height of the components 2. Actually, the reflected scattered laser beam 6g is partially reflected at the reflection mirror 10 and directed toward the polygon mirror 7. However, for convenience of explanation, a principle for obtaining height data of the components 2 is explained by a position detector 203 shown in FIG. 2 instead of the position detector 103a. If the incident laser beam 6f is reflected on the printed circuit board 1 at point A 19, the reflected beam converges into a spot on a PSD 17 at point D 22 by the condenser lens 16; if the incident laser beam 6f is reflected on the printed circuit board 1 at point B 22, the reflected beam converges into a spot at point E 23; if the incident laser beam 6f is reflected on the printed circuit board 1 at point C 21, the reflected beam converges into a spot at point F 24. Therefore, the position of the beam spot indicates height of the components 2 from the level of the printed circuit board 1, or salient of the printed board 1. The beam spot position is detected by PSD 17 of the beam spot position detector 203, as mentioned above. Actually, the laser beam reflected on the printed circuit board 1 or components 2 is reflected at the reflection mirror 10 to direct it toward the position detector 103a through the polygon mirror 7. The reflection mirror 10 reflects a part of scattered light from the printed circuit board 1 or components 2 which makes a given angle between laser beam 6f and 6g. If a reflection angle of reflected light on printed circuit board 1 or components 2 is small or near a right angle, the reflected light contains noise components with respect to height of the component data. For example, a laser beam regularly reflected at point C 21 wich includes less information of height advances toward point H 26 and not to the position detector 103a. Therefore, the reflection mirror 10 selectively reflects a signal component of laser light from the printed circuit board 1 with a given suitable angle. Since the laser beam 6e from the polygon mirror 7 strikes onto the printed circuit board 1 perpendicularly due to the polygon mirror 7 located near a focus point of the fθ lens, the laser beam reflected on the printed circuit board 1 returns to the polygon mirror 7 through the reflection mirror 10.

The detected position signal 13, as the printed circuit board 1 is scanned thereover, is sequentially sent to the position signal processing circuit 14a which converts the position signal 13 into a digital height data of the components 2, as mentioned above. The output of the position signal processing circuit 14a is sent to the judging circuit 15a. The judging circuit 15a subtracts the height data from reference data of corresponding point of the printed circuit board 1 and compares the resultant with threshold data corresponding to the points of printed circuit board 1. This provides a judgment whether an error on the height data of components 2 lies within a predetermined allowable range, as mentioned above. This operation is repeated until the printed circuit board 1 is scanned over.

The reference data of height stored in the memory 35 is obtained from designing data of the printed circuit board 1. However, it is better that the reference data is obtained by actually scanning the assembled standard printed circuit board 1 because the design data may be inconsistent with the actual size of the printed circuit board 1. This technique is described in the second embodiment.

Figure 3A:
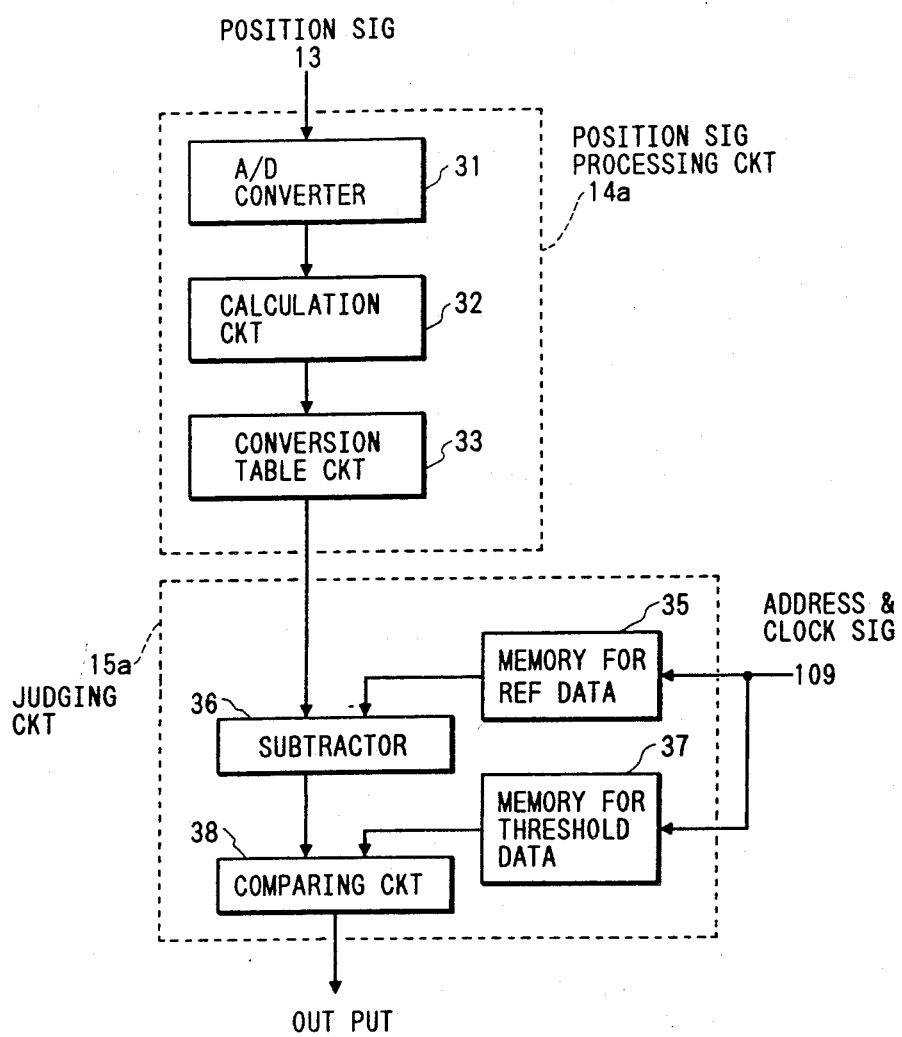
FIG. 3A is a block diagram of the position data processing and judging circuits of FIG. 1.
Figure 3B:
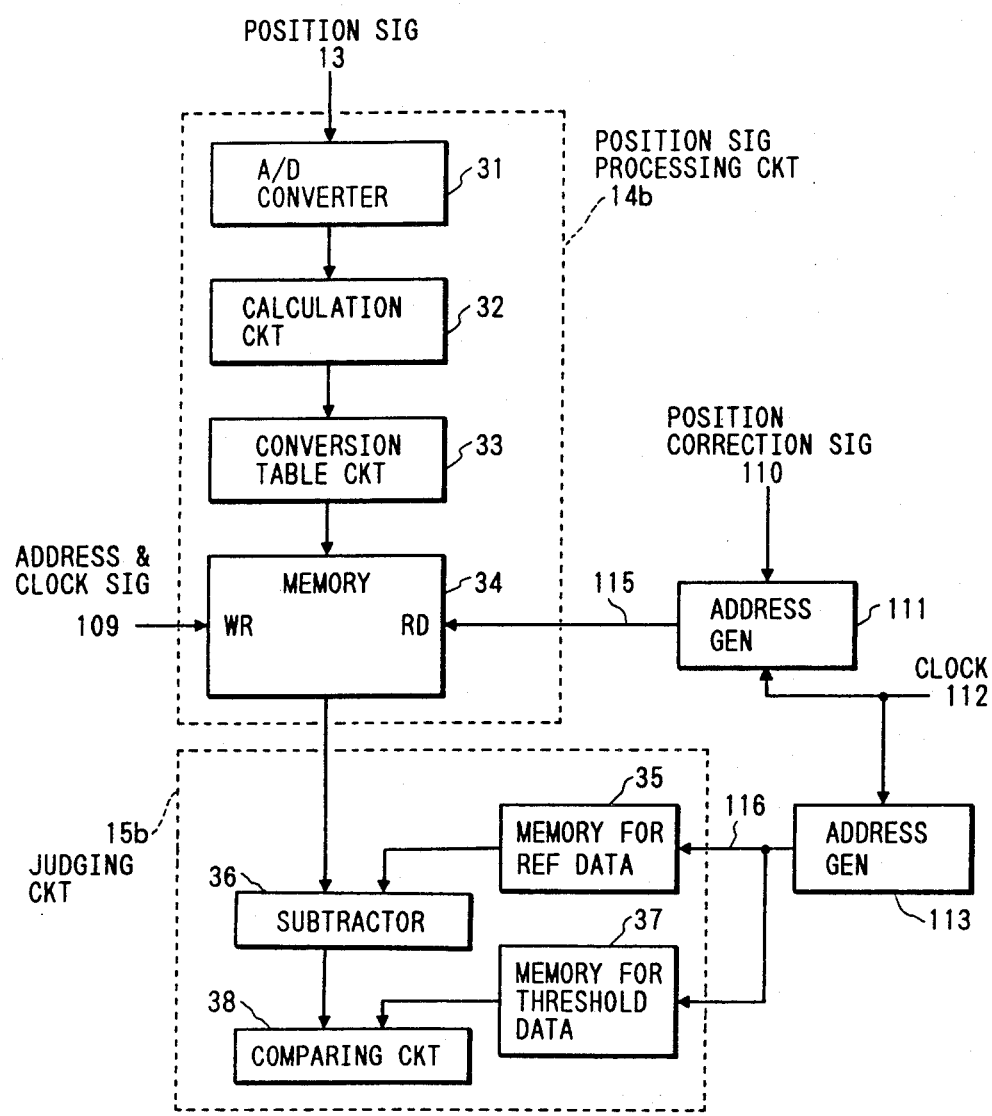
FIG. 3B is a block diagram of the position data processing and judging circuits of first modified embodiment of first embodiment.

Hereinbelow will be described a first modified embodiment of the first embodiment with reference to FIG. 3B.

A main block diagram of the modified embodiment is the same as the first embodiment, which is shown in FIG. 1. A difference between the first modified embodiment and the first embodiment is that the position signal 13 is processed by an position signal processing circuit 14b and an output of the position signal processing circuit 14b is processed by a judging circuit 15b shown in FIG. 3B. The printed circuit board 1 is scanned, as described in the first embodiment.

The position signal 13 is converted into digital height data by a/d converter 31 and calculation circuit 32, and conversion table circuit 33, as mentioned in the first embodiment. An output of the conversion table circuit 34 is sent to a memory 34 which stores it in response to the address and clock signals 109 which are produced by the address signal generator 107. The memory 34 stores height data over the printed circuit board 1 firstly. The stored data is read in response to address and clock signals 115 from an address generator 111 which generates the address signal in response to a clock signal 112. The address signal generator 111 changes address data therein by adding an offset to the address data or subtract an offset from the address data in response to a position correction signal 110. This changes start point of reading out height data of the printed circuit board 1 for eliminating accurate adjusting of position of the printed circuit board 1 with respect to the carrying means 3. The clock signal 112 is applied to an address generator 113 also which generate address and clock signals 116 for the memories 35 and 37.

Figure 3C:
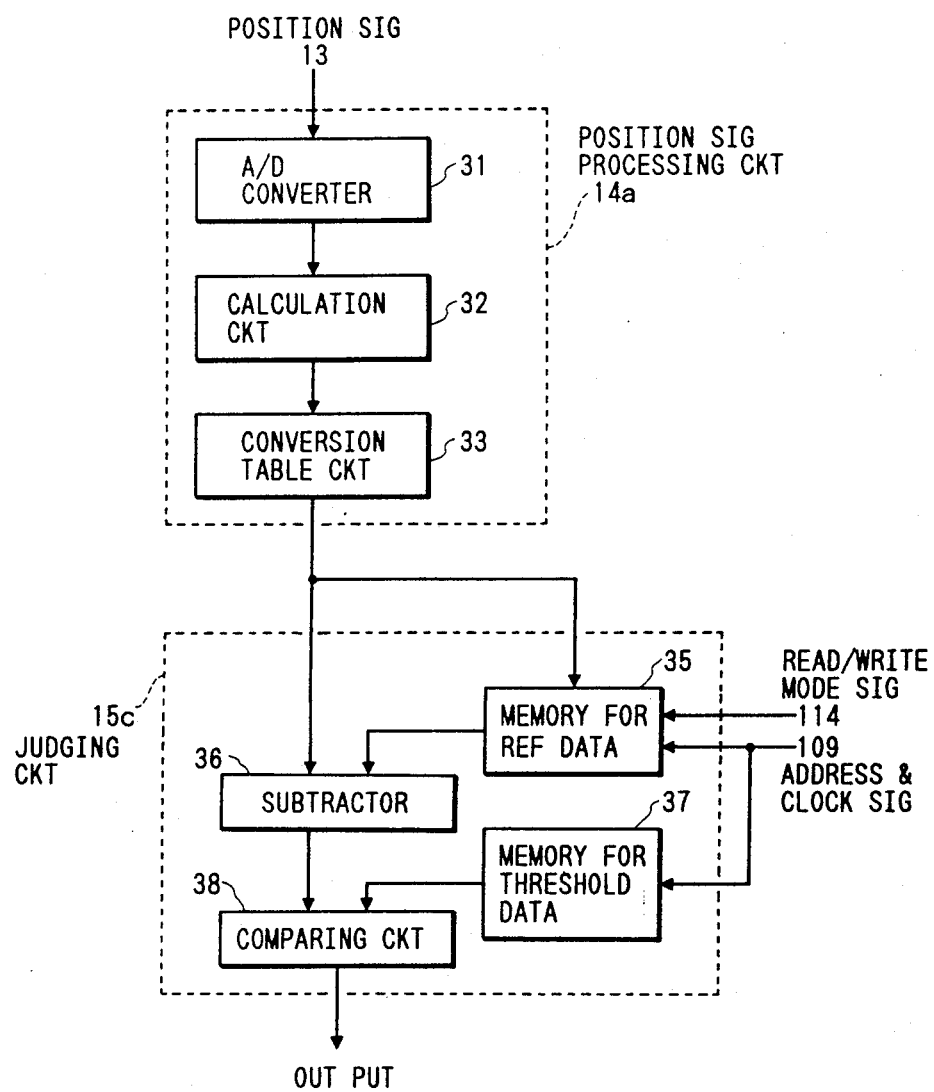
FIG. 3C is a block diagram of the position data processing and judging circuits of second modified embodiment of first embodiment.

Hereinbelow will be described a second modified embodiment of the first embodiment with reference to FIG. 3C.

A main block diagram of the modified embodiment is the same as the first embodiment, which is shown in FIG. 1. A difference between the second modified embodiment and the first embodiment is that the output of the position signal processing circuit 14a is sent to the memory 35' in addition to the subtractor 36. The memory 35' can store the output signal of the position signal processing circuit 14a in response to a read/write mode signal 114. At first, an assembled printed circuit board 1 which is visually checked whether components 2 are normally soldered. Then, the checked printed circuit board 1 is scanned and the output signal of the position signal processing circuit 14a is stored in the memory 35' as reference data in response to a read/write mode signal 114 and the address and clock signals 109. When printed circuit board 1 to be inspected is scanned, the read/write mode signal 114 is changed over and thus the memory 35' outputs reference data in the same way as the first embodiment in response to the address and clock signals 109. The position signal 13 is processed by the position signal processing circuit 14a and an output of the image processing circuit 14a is processed by a judging circuit 15c. The printed circuit board 1 is scanned as described at first embodiment. The memory 35' can store the reference height data from output of the image processing circuit 14a. This causes that the reference data is obtained by actually scanning the assembled standard printed circuit board 1 and the reference data obtained in this way is more accurate than that obtained from the design data. This is because the designing data is often inconsistent with the actual size of components 2 on the printed circuit board 1.

Hereinbelow will be described a second embodiment of the apparatus with reference to FIG. 5.

Figure 5:
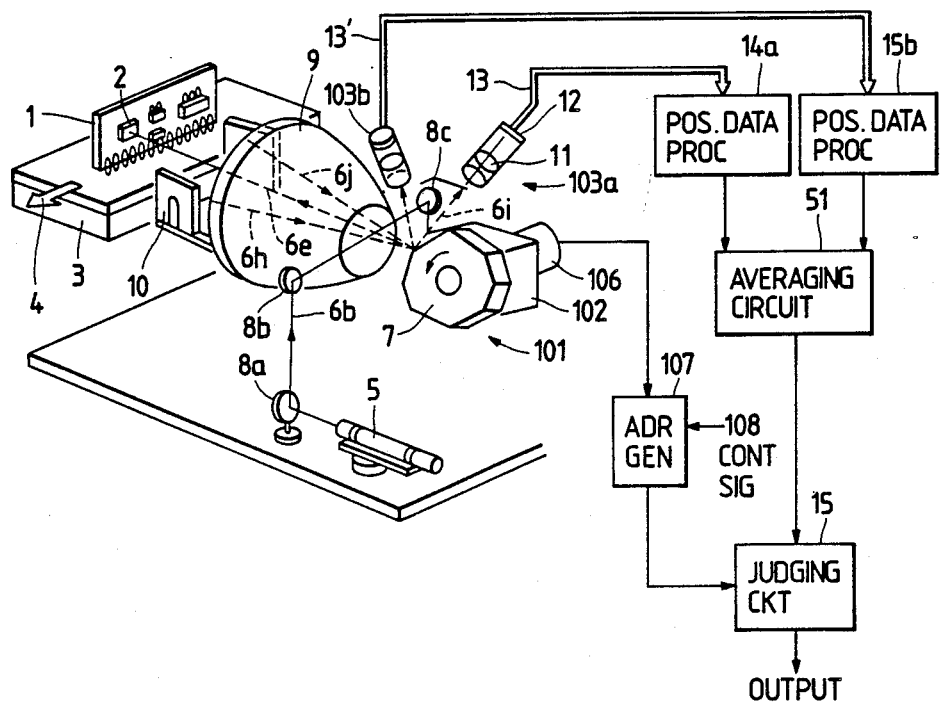
FIG. 5 is a block diagram of linescan apparatus of the second embodiment.

In FIG. 5, a linescan apparatus for detecting salient pattern on a surface of a product of a second embodiment comprises a reflection mirror 10' corresponding to the reflection mirror 10 which also reflects scattered laser light from the surface of the printed circuit board 1 or components 2 to direct the laser light to the polygon mirror 7, position detector 103b for receive laser light from the reflection mirror 10' through the polygon mirror 7, a position data processing circuit 14b for generating digital height signal from position signal 13', and an averaging circuit 51 for averaging the height signals from the position signal processing circuit 14a and 14b in addition to the structure of the first embodiment. In FIG. 5, the reflection mirrors 10 and 10' are symmetrically arranged with respect to scanning plane of the laser beam 6e. The scattered laser lights 6h and 6i from the surface of the printed circuit board 1 or components 2 are sent to the position detectors 103a and 103b through the reflection mirrors 10 and 10' respectively and through the polygon mirror 7. The position detector 103a and 103b detect laser beam spot position P to produce position signals 13 and 13' respectively. The position signals 13 and 13' are converted into digital height data by position signal processing circuit 14a and 14b respectively. Outputs from the position signal processing circuits 14a and 14b are sent to the averaging circuit 51 which averages the outputs from the position data processing circuits 14a and 14b. An output signal of the averaging circuit 51 is sent to the judging circuit 15a which makes a judgment whether detected height data lies with in a allowable range.

As mentioned above, since in this embodiment the height data of the components 2 from the surface of the printed circuit board 1 are obtained by averaging height data from two channel of position detectors 103a and 103b and reflection mirrors 10 and 10', noise components produced in detection process is reduced and thus, the resultant height data is more accurate than that of the first embodiment.

What is claimed is:

1. A linescan apparatus for detecting salient pattern on a surface of a product comprising:
   (a) a laser light source for continuously emitting a laser beam;
   (b) a polygon mirror for reflecting said laser beam;
   (c) drive means for rotating said polygon mirror to scan said laser beam;
   (d) an fθ lens for focusing said laser beam from said polygon mirror onto a first plane perpendicular to a second plane in which said laser beam reflected at said polygon mirror is scanned, said fθ lens being arranged such that said polygon mirror located near a focus point of said fθ lens to cause said laser beam therefrom strikes against said first plane substantially perpendicularly;
   (e) carrying means for moving said product along said first plane in the direction substantially perpendicular to said second plane;
   (f) a mirror for reflecting said laser beam reflected at said surface of said product to direct said laser beam to said polygon mirror through said fθ lens, said mirror being positioned apart from said second plane; and
   (g) detecting means for detecting unidimensional position variation of a beam spot made thereon by said laser beam from said mirror via said polygon mirror.

2. A linescan apparatus as claimed in claim 1, further comprising:
   (a) signal generating means for generating a read signal in response to rotation of said polygon mirror;
   (b) storing means for storing preset data and for outputting said preset data in response to said read signal; and
   (c) a subtractor for obtaining difference between an output signal from said beam position detecting means and preset data.

3. A linescan apparatus as claimed in claim 2, further comprising:
   (a) second storing means for storing second preset data and for output said second preset data in response to said read signal; and
   (b) comparing means for comparing an output signal from said subtractor with said second preset data.

4. A linescan apparatus as claimed in claim 1, further comprising:
   (a) signal generating means for generating a read signal in response to rotation of said polygon mirror;
   (b) storing means for storing said output from said position detecting means in response to said read signal and for outputted said stored output in response to said read signal and an external signal; and
   (c) substrator for obtaining difference between an output signal from said beam position detecting means and preset data.

5. A linescan apparatus as claimed in claim 4, further comprising:
   (a) second storing means for storing second preset data and for output said second preset data in response to said read signal; and
   (b) comparing means for comparing an output signal from said subtractor with said second preset data.

6. A linescan apparatus as claimed in claim 1, further comprising:
   (a) signal generating means for generating a write signal in response to rotation of said polygon mirror;
   (b) storing means for storing said output from said position detecting means in response to said write signal and for outputting said stored output in response to an external signal; and (c) address changing means for changing start point of said stored output in response to a correction signal.

7. A linescan apparatus as claimed in claim 1, wherein said detection means is a position sensitive detector.

8. A linescan apparatus for detecting salient pattern on a surface of a product comprising:

(a) a laser light source for continuously emitting a laser beam;

(b) a polygon mirror for reflecting said laser beam;

(c) drive means for rotating said polygon mirror to scan said laser beam;

(d) an fθ lens for focusing said laser beam from said polygon mirror onto a first plane perpendicular to a second plane in which said laser beam reflected at said polygon mirror is scanned, said fθ lens being arranged such that said polygon mirror located near a focus point of said fθ lens to cause said laser beam therefrom strikes against said first plane substantially perpendicularly;

(e) carrying means for moving said product along said first plane in the direction substantially perpendicular to said second plane;

(f) first and second mirrors said laser beam reflected at said surface of said product to direct said laser beam to said polygon mirror through said fθ lens, said first mirrors being positioned apart from said second plane, said second mirror bing positioned at counter position of said first mirror with respect to said first plane;

(g) first and second detecting means for detecting unidimensional position variation of beam spots made thereon by said laser beam from said first and second mirrors via said polygon mirror respectively; and (h) averaging means for averaging outputs from said first and second beam potion detecting means.

9. A linescan apparatus as claimed in claim 8, wherein said detection means is a position sensitive detector.

* * * * *